United States Patent
Ban et al.

[11] Patent Number: 6,060,773
[45] Date of Patent: May 9, 2000

[54] SEMICONDUCTOR CHIP AND METHOD OF MANUFACTURING THE SAME

[75] Inventors: Hiroshi Ban; Masaaki Tanno; Tadao Takeda, all of Tokyo, Japan

[73] Assignee: Nippon Telegraph and Telephone Corporation, Tokyo, Japan

[21] Appl. No.: 09/074,437

[22] Filed: May 7, 1998

[30] Foreign Application Priority Data

May 15, 1997 [JP] Japan ................................ 9-125636

[51] Int. Cl.⁷ ............................ H01L 23/58; H01L 23/02
[52] U.S. Cl. ............................................ 257/679; 257/922
[58] Field of Search ................................... 257/922, 296, 257/316, 314, 679

[56] References Cited

U.S. PATENT DOCUMENTS

| | | | |
|---|---|---|---|
| 4,328,414 | 5/1982 | Atalla | 235/380 |
| 4,453,074 | 6/1984 | Weistein | 235/380 |
| 5,131,091 | 7/1992 | Mizuta | 395/725 |
| 5,450,366 | 9/1995 | Watanabe | 365/226 |
| 5,510,655 | 4/1996 | Tanielian | 257/774 |
| 5,608,718 | 3/1997 | Schiewe | 369/275.4 |

FOREIGN PATENT DOCUMENTS

| | | |
|---|---|---|
| 63-19357 | 8/1988 | Japan . |
| 64-23436 | 1/1989 | Japan . |
| 64-23437 | 1/1989 | Japan . |
| 64-4934 | 1/1989 | Japan . |
| 4-303692 | 10/1992 | Japan . |
| 6-191137 | 7/1994 | Japan . |
| 8-147433 | 6/1996 | Japan . |
| 9-118086 | 5/1997 | Japan . |
| WO 97/14146 | 4/1997 | WIPO . |

*Primary Examiner*—Brian Dutton
*Attorney, Agent, or Firm*—Blakely Sokoloff Taylor & Zafman

[57] ABSTRACT

A semiconductor chip has a nonvolatile memory formed on the upper surface side of a semiconductor substrate. The chip includes at least one recess portion formed in the lower surface of the semiconductor substrate. The recess portion is located in a region corresponding to the nonvolatile memory. A method of manufacturing the semiconductor chip is also disclosed.

9 Claims, 5 Drawing Sheets

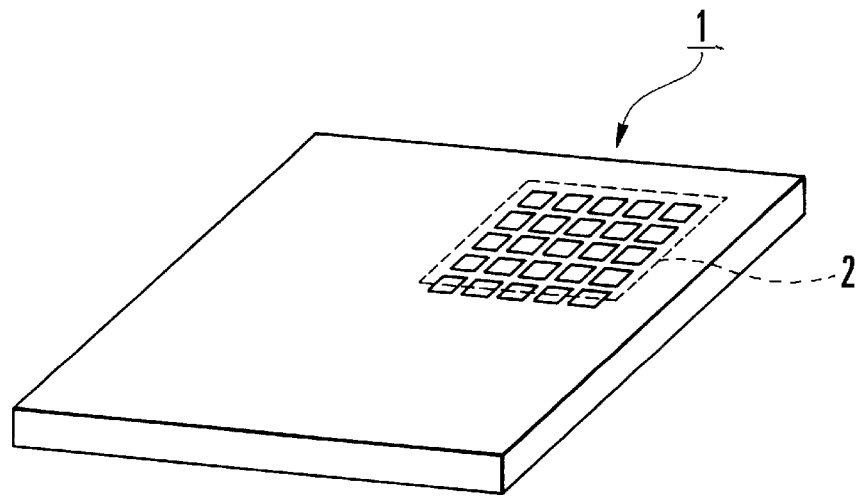
F I G. 1A
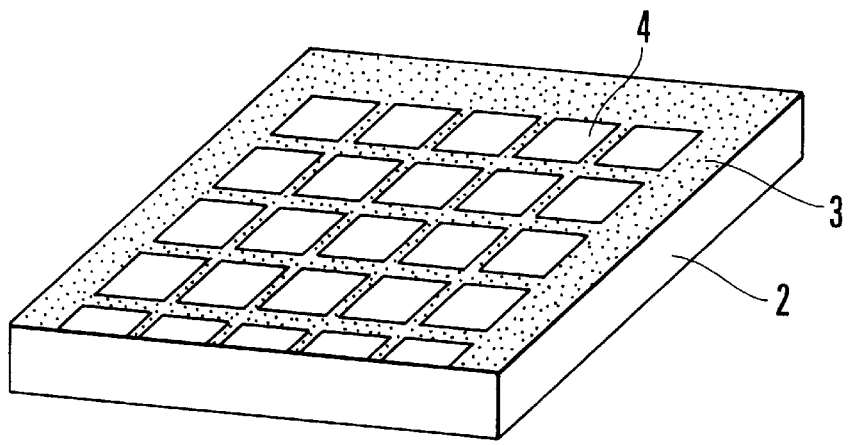
F I G. 1B
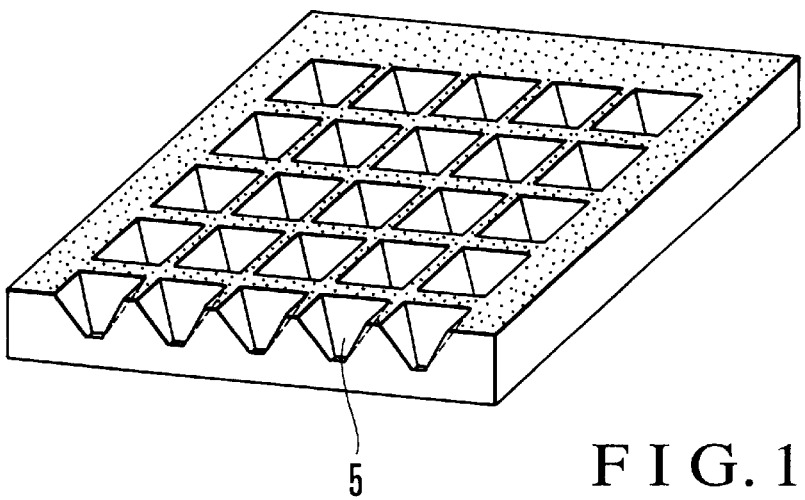
F I G. 1C

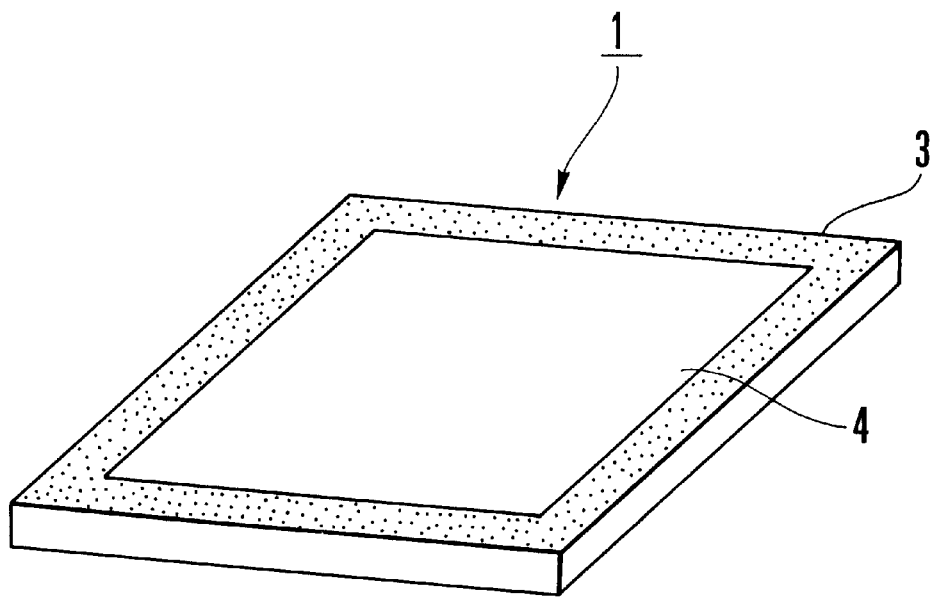
F I G. 2 A
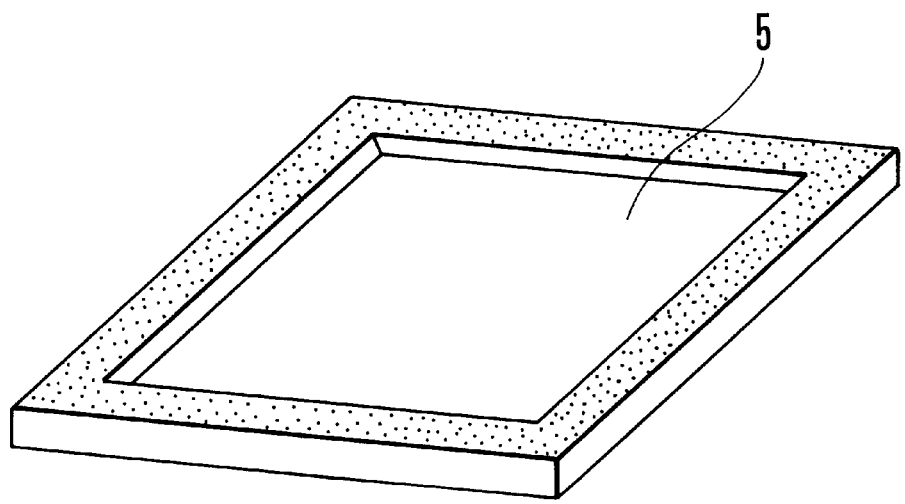
F I G. 2 B

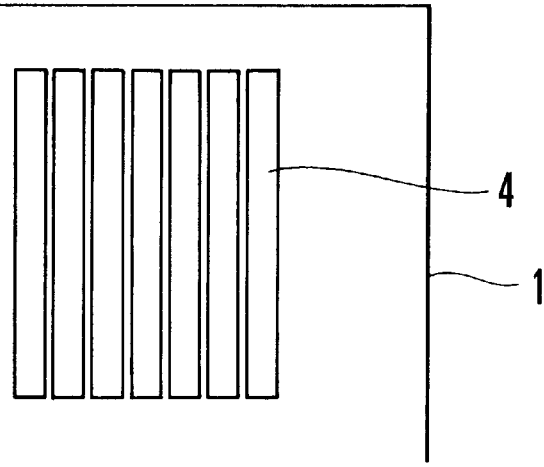
F I G. 4
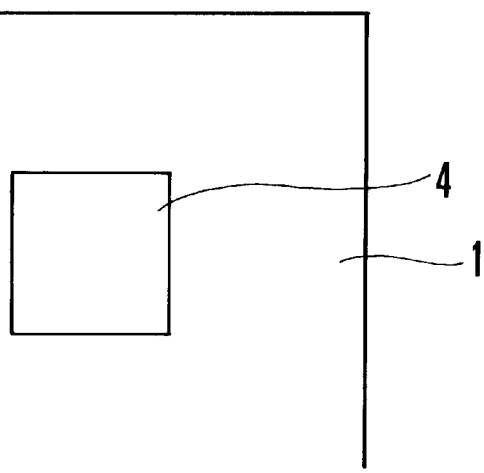
F I G. 5
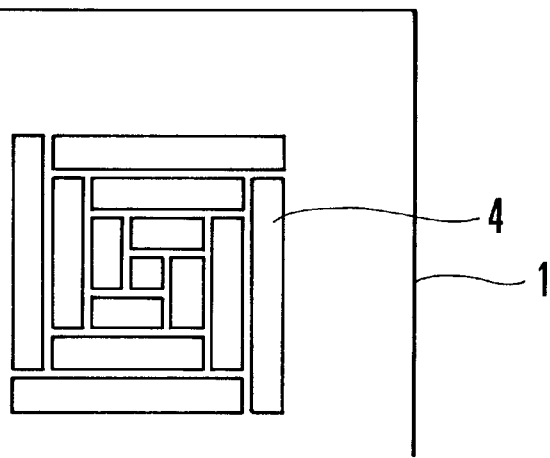
F I G. 6

SEMICONDUCTOR CHIP AND METHOD OF MANUFACTURING THE SAME

BACKGROUND OF THE INVENTION

The present invention relates to a semiconductor chip used for an IC card or the like and a method of manufacturing the same.

A semiconductor chip intensively incorporates intellectual property information such as original ideas associated with circuit patterns and manufacturing techniques and program information stored in a nonvolatile memory (e.g., an EEPROM).

In consideration of information management, some proper measures must be taken to prevent such information from leaking by a fraudulent means.

Most of such information associated with a circuit pattern and manufacturing techniques and stored information can be decoded from the major surface of the substrate with an optical observation means such as a microscope as long as the circuit pattern is exposed.

In a popular plastic-molded semiconductor chip, a circuit pattern is encapsulated with an opaque molding resin to be kept invisible. In addition to the sealing compound, a soft error protective film is formed on the circuit surface. Furthermore, in flip chip bonding, a mount substrate opposes a circuit pattern. For these reasons, it is not very easy to expose the surface of the circuit pattern.

There is, however, a possibility that the molding resin is removed by some proper method, and the circuit pattern is exposed by mechanically separating the semiconductor chip bonded to the lead frame therefrom.

In consideration of such a conventional problem, therefore, a semiconductor chip may be made fragile by making the semiconductor substrate thinner than usual, thereby preventing fraudulent decoding of circuit pattern information and the like.

If, however, the entire semiconductor substrate is thinned, the resultant structure lacks in strength for wafer dicing or bonding.

In addition, when the entire semiconductor substrate is thinned, the strength of the substrate uniformly decreases. A part to be crushed is unknown, and a nonvolatile memory or the like which must be destroyed may be left intact.

SUMMARY OF THE INVENTION

It is, therefore, a principal object of the present invention to provide a semiconductor chip which can prevent fraudulent decoding of information about techniques incorporated in the semiconductor chip, and a method of manufacturing the same.

To solve the above problem, according to the present invention, when a semiconductor chip bonded to a lead frame or the like is fraudulently separated from it, the semiconductor chip is crushed to disable the function of the semiconductor chip.

In order to achieve the above object, according to an aspect of the present invention, there is provided a semiconductor chip having a nonvolatile memory formed on an upper surface side of a semiconductor substrate, comprising at least one recess portion formed in a lower surface of the semiconductor substrate, wherein the recess portion is located in a region corresponding to the nonvolatile memory.

According to another aspect of the present invention, there is provided a method of manufacturing a semiconductor chip having a nonvolatile memory formed on an upper surface side of a semiconductor substrate, comprising the steps of forming an etching mask having at least one opening portion in a lower surface of a portion of the semiconductor substrate which corresponds to the nonvolatile memory, and selectively etching a lower surface of a portion of the semiconductor substrate which is exposed from the opening portion of the etching mask, thereby forming a recess portion in the lower surface of the semiconductor substrate.

BRIEF DESCRIPTION OF THE DRAWINGS

FIGS. 1A, 1B, and 1C are perspective views showing an embodiment of the present invention;

FIGS. 2A and 2B are perspective views showing another embodiment of the present invention;

FIGS. 3A and 3B are views showing a recess portion 5 formed in the (100) plane of a silicon substrate by etching using an alkali, in which FIG. 3A is a perspective view of the recess portion, and FIG. 3B is a sectional view taken along a line A–A' in FIG. 3A;

FIGS. 4, 5, 6, 7, and 8 are plan views showing other embodiments of the present invention.

DESCRIPTION OF THE PREFERRED EMBODIMENTS

Figure 3A:
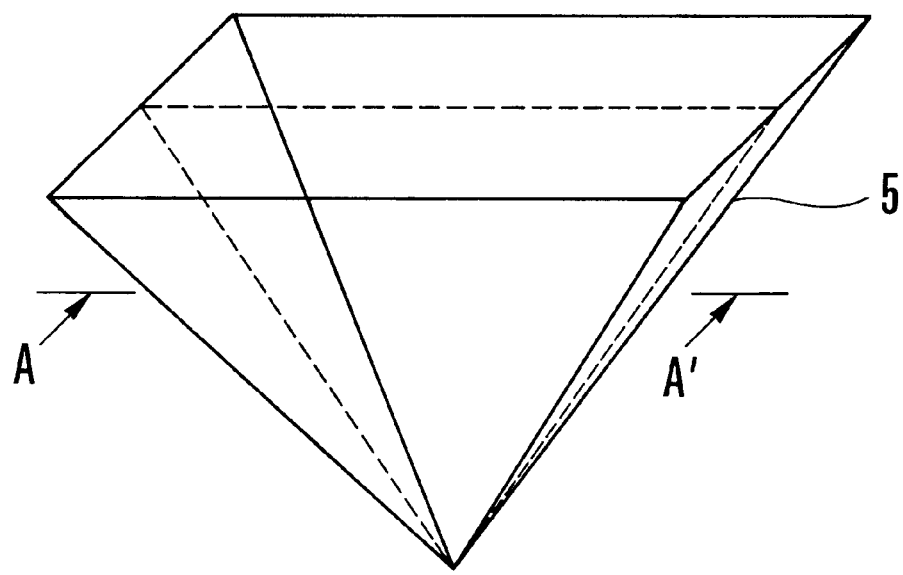

An embodiment of the present invention will be described next with reference to the accompanying drawings.

FIGS. 1A to 1C show an embodiment of the present invention. Referring to FIG. 1A, a silicon substrate 1 has a thickness of 370 $\mu$m, and semiconductor elements (not shown) are formed on the upper surface side to form semiconductor chips. For example, nonvolatile memories such as EEPROMs are formed as these semiconductor elements.

FIG. 1B is an enlarged view of a region (a region 2 in which a nonvolatile memory is formed) enclosed with the dashed line in FIG. 1A. An etching mask 3 having predetermined opening portions 4 is formed on the lower surface of the silicon substrate 1. The etching mask 3 is a silicon oxide film formed on the lower surface of the silicon substrate 1. The 400-$\mu$m-square opening portions 4 are formed in this film at a pitch of 500 $\mu$m by a laser grinder using a KrF excimer laser or the like.

The lower surface of the silicon substrate 1 is dipped in a 30% KOH solution at 70° C. to undergo wet etching for four hours. As a result, 220-$\mu$m deep recess portions 5 in the shape of a quadrangular frustum are formed in the lower surface of the silicon substrate 1, as shown in FIG. 1C.

The strength of the silicon substrate 1 having the recess portions 5 formed in its lower surface becomes lower than that of the substrate before the formation of the recess portions 5. If, therefore, an excessive stress is externally exerted to the semiconductor substrate, the substrate is crushed to prevent the leakage of information from the semiconductor chip.

Only one such recess portion may be formed in the lower surface of an element formation region on a semiconductor chip. More specifically, as shown in FIG. 2A, an etching mask 3 having an opening portion 4 may be placed on the lower surface of a semiconductor chip corresponding to an element formation region. The lower surface of a silicon substrate 1 which is exposed to the opening portion 4 may be etched with reference to the etching mask 3, thereby forming a recess portion 5 like the one shown in FIG. 2B.

In this case, the edge of the semiconductor chip is preferably left intact without being etched. More specifically, the strength required in the process of dicing the wafer into semiconductor chips and wafer bonding can be maintained by making the thickness of a region along the scribing line of the semiconductor chip equal to that of the wafer. In the case of a substrate having a thickness of 200 to 400 μm, the thickness of a region about 100 μm inside the edge of a semiconductor chip is preferably kept equal to that of the wafer. If the thickness of a region an aspect ratio up to 1 from the edge of a semiconductor chip (for example, in the case of a substrate having a thickness of 200 μm, a region having a range falling within 200 μm from the edge of the semiconductor chip) is kept equal to that of the wafer, the dicing strength can be maintained more reliably.

In addition, a plurality of recess portions may be formed in the lower surfaces of all element formation regions, or may be formed in the lower surfaces of only specific regions. If, for example, recess portions are formed in the lower surfaces of only specific regions such as a region in which a nonvolatile memory storing important information is formed and a region in which a circuit having an important industrial property associated with its structure is formed, regions preferentially destroyed in the order of the degrees of importance can be set. This process will be described in detail in the following embodiments.

A silicon substrate transmits light in the near-infrared region to the infrared region relatively well. A technique of observing a circuit pattern image on the upper surface from the lower surface of a substrate by scanning a laser beam having such a wavelength can be almost used in practice. Since this observation technique from the lower surface side is a new measuring technique, conventional semiconductor chips are currently more vulnerable. In a semiconductor chip which is surface-mounted by flip chip bonding, in particular, the lower surface can be exposed very easily. Strong demands have therefore arisen for easy, effective fraud prevention measures against observation from the lower surface of a silicon substrate. In addition, as the information to be stored, programs with high value added are often stored in a nonvolatile memory region on a semiconductor chip. That is, how to take fraud prevention measures for such a region is an important, urgent matter.

Under the circumstances, the recess portion 5 is preferably V-shaped or trapezoidal in cross section to have inclined inner surfaces. With this structure, observation light vertically coming into the lower surface of the substrate is refracted or reflected by the inclined surfaces of the recess portion but does not propagate straight. A circuit pattern image of a circuit located on a vertical line cannot be observed from the lower surface side by an optical means such as a laser scanning microscope.

The recess portion 5 having a trapezoidal cross-section may have a flat bottom. In this case, however, there is a possibility that a circuit on the upper surface side which corresponds to the flat bottom is observed. For this reason, the bottom surface is preferably roughened. If the degree of unevenness of the roughened surface is smaller than the observation wavelength, this roughened surface is equivalent to a smooth surface. The degree of unevenness of the roughened surface is therefore preferably larger than the observation wavelength. It suffices, in observation from the lower surface side, if observation light having a wavelength of 600 nm to 5 μm, and more preferably 700 nm to 2 μm, is taken into consideration. By making the degree of unevenness of the roughened surface lager than the above wavelengths, incident light is complicatedly refracted. Therefore, the circuit pattern and the like cannot be observed.

In addition, the inclined inner surfaces of the recess portion 5 need not be smooth. Furthermore, the recess portion 5 may be constituted by a group of trapezoidal surfaces and the like.

Consider a stepped inclined surface having surfaces parallel and perpendicular to the lower surface. In this case, if the size of the stepped portions is smaller than the wavelength of observation light, no problem is posed because this inclined surface exhibits a function equivalent to that of a smooth inclined surface. If, however, the size of the stepped portions is equal to or larger than the wavelength of observation light, the function deteriorates accordingly.

The depth of the recess portion 5 will be described next.

The preferred depth of the recess portion 5 varies depending on the intended effect. More specifically, (1) to make optical observation difficult, the depth can be set to 5 μm or more because the recess portion 5 having a depth of about 5 μm, at most, exhibits the satisfactory effect; (2) to make the semiconductor substrate fragile, the depth is preferably set to be ½ or more of the thickness of the substrate.

When, for example, a substrate having a thickness of about 300 μm is to be used, recess portions having a depth of 150 μm or more can be formed. In this case, the substrate can be made fragile, and at the same time, a satisfactory optical effect can be obtained.

If, however, the shortest distance between the bottom of each recess portion and the upper surface of the semiconductor substrate (i.e., the minimum substrate thickness) is sufficiently large, the lower surface may be planarized by mechanically polishing the substrate. To prevent such a fraud, the shortest distance is preferably set to less than 100 μm.

If, therefore, the shortest distance between the bottom of each recess portion and the upper surface of the semiconductor substrate is less than ½ the substrate thickness or less than 100 μm, the best effect can be obtained. Obviously, the shortest distance between the bottom of each recess portion and the upper surface of the semiconductor substrate must be large enough not to impair the functions of semiconductor elements. For example, this distance can be decreased to about 10 μm.

Techniques of forming the recess portion 5 will be described next.

Several types of techniques of forming recess portions according to the present invention are available. For example, mechanical grinding, dry etching, wet etching, and the like can be effectively used. In the present invention, wet etching is considered as an optimal technique for the following reasons. However, it should not be understood that techniques other than wet etching are inappropriate. Other techniques may be used depending on conditions.

(1) Mechanical Grinding

Linear V-shaped grooves can be easily formed by mechanical grinding.

It is, however, technically difficult to form isolated recess portions such as quadrangular prisms by mechanical grinding. In addition, when the thickness of specific portions is decreased to less than 100 μm. the functions of elements may be impaired upon exertion of an excessive stress.

(2) Dry Etching

A recess portion having a rectangular cross-section or a recess portion having inclined inner surfaces can be formed by plasma dry etching.

In such plasma dry etching, however, elements may be damaged by charge-up. In addition, it is technically difficult to form an etching mask used to etch a recess portion having a depth of several 100 μm.

(3) Wet Etching

Wet etching can be performed at moderate temperatures, allows the use of a thin etching mask, and costs less. In addition, when a silicon substrate is to be etched with an aqueous basic solution, since etching rates in the respective crystal plane orientations differ by an order of magnitude or more, anisotropic etching can be performed. If, for example, a (100) substrate is used, the (111) plane for which the etching rate is low is left. As a result, an inclined surface with an angle of about 55° can be easily formed. Depending on the shape or direction of an opening portion, however, a surface of an order higher than that of the (111) plane may be exposed, and etching may apparently stop. If an etching mask has a circular opening portion, a cross-section of the formed recess portion which is parallel to the substrate surface normally becomes a rectangular shape circumscribing a circle.

In addition, it is obvious that this wet etching method is effective, because once the size of each opening portion to be formed in the lower surface is determined in forming V-shaped recess portions, the depth of each opening portion is almost uniquely determined.

In the present invention, therefore, a method of forming recess portions in the lower surface of a silicon substrate with the (100) plane orientation by wet etching using an aqueous basic solution is considered as an effective method. The present invention can be effectively applied to a popular CMOS semiconductor element, in particular, because the element is generally formed on a silicon substrate with the (100) plane orientation.

It is generally known well that an aqueous 10 to 40% NaOH or KOH solution or an organic alkaline solution can be effectively used as an aqueous basic solution. In the present invention, etching is performed by using such a solution. In addition, anisotropic etching can be performed by using a substrate with the (110) plane orientation and an aqueous basic solution. With the use of linear patterns aligned with the <1, −1, −2> orientation, grooves each having vertical side walls and a rectangular cross-section can be formed. With this structure, therefore, an effect of preventing optical observation is difficult to obtain, but each semiconductor chip can be made fragile by partly decreasing the thickness of the substrate.

Note that recess portions may be formed by etching a substrate using a generally known acid solution such as a solution mixture of hydrofluoric acid, nitric acid, and glacial acetic acid. When such a solution mixture is used, isotropic etching is performed almost independently of the plane orientations. However, since the etching rate is high, a high throughput can be expected.

In addition, any material can be used as an etching mask material as long as it has sufficient resistance to an etching solution and can be patterned by any appropriate method. For example, use of an organic polymer as an etching mask material facilitates the process.

With the use of an organic polymer as an etching mask material, since an etching solution is likely to erode the interface between the organic polymer and the substrate, the edge of each recess portion tends to move backward. In contrast to this, use of a silicon nitride or silicon oxide film as an etching mask allows substrate etching to form a recess portion with its edge hardly moving backward from an opening portion formed in the mask, thus controlling the shape of each recess portion with high precision, even though the number of steps increases.

Opening portions may be formed in an etching mask material by a common lithographic process, lithography using an electron beam or ion beam, or laser abrasion after the etching mask material is formed as a film. In addition, a method of printing patterns or another method may be used.

In the present invention, recess portions are formed in a wafer before dicing it into semiconductor chips. No problem is posed, however, even if this process is performed after the substrate is diced into semiconductor chips. In flip chip bonding, the process can be performed after bonding.

Furthermore, a resin film, an inorganic film, a metal film, or the like can be formed on part or all of the lower surface of a semiconductor chip according to the present invention, which includes recess portions, for the purpose of providing dynamic reinforcement, moisture resistance, printing, and the like, without posing any problem. When an electromagnetic wave having a wavelength of 600 $\mu$m to 5 $\mu$m, which is often used for laser measurement, is used, and the film has a refractive index different from that of the substrate material, in particular, refraction inevitably occurs at the interface between the film and the substrate regardless of external environments, thereby interfering with laser measurement. The formation of such a film is therefore preferable.

In this case, the film preferably has a surface shape different from that of each recess portion, rather than having a shape parallel to each recess portion, because incident observation light undergoes more complicated refraction at the interface between the outer air and the film and the interface between the film and each recess portion of the substrate. This makes observation of an image more difficult.

A good effect can also be obtained by coating a semiconductor chip with a material that becomes opaque upon application of an electromagnetic wave in a wavelength region of 600 $\mu$m to 5 $\mu$m instead of the above film. If, for example, a metal such as tungsten, molybdenum, gold, titanium, tantalum, aluminum, or copper is only deposited on a chip to a thickness of 0.1 to 0.5 $\mu$m, observation light from the lower surface is reflected. This therefore makes observation more difficult.

The present invention will be described by way of its examples. However, the present invention is not limited these examples. For example, the present invention can be applied to a chip made of a compound semiconductor material such as gallium arsenide.

EXAMPLE 1

A 0.7-$\mu$m thick silicon oxide film was formed on the mirror-polished lower surface of a 370-$\mu$m thick silicon substrate with the (100) plane orientation, on the upper surface of which a plurality of integrated circuits were formed, by the CVD method. To protect the upper surface of the substrate, a 4-$\mu$m thick film made of the Cyclotene (trade name given by Dow Chemical Japan K. K.) was formed on the upper surface of the substrate by spin coating. The resultant structure was then baked at 200° C.

A laser grinder using a KrF excimer laser was used to form a 5×5 array pattern of opening portions (see FIG. 1B) on the silicon oxide film on the lower surface at a position immediately below a 2-mm-square nonvolatile memory region formed on the substrate. More specifically, 400-$\mu$m-square opening portions, each defined by lines (corresponding to the <0, 1, 0> orientation) perpendicular to the facet and lines (corresponding to the <0, 1, 0> orientation) parallel to the facet, were formed in the silicon oxide film at a pitch of 500 $\mu$m. This substrate was then dipped in an aqueous 30% KOH solution at 70° C. to undergo etching for four hours. As a result, an array of recess portions 5 in the shape of a quadrangular frustum were formed in the silicon substrate (see FIG. 1C). Note that after the recess portions 5 were formed, the silicon substrate is diced into the respective semiconductor chips.

In this case, the depth of each recess portion 5 was 200 μm, and the inclined surfaces and bottom surface of each recess portion were almost smooth. When a circuit pattern image was observed, with an infrared laser scanning microscope with a wavelength of about 1.2 μm, by causing a laser beam to vertically come into the recess portion 5 from the lower surface side, a correct image could not obtained on the inclined surfaces of the recess portion 5.

Referring to FIG. 1C, the recess portions 5 parallel or perpendicular to the facet are formed. In this state, etching stops at high-order planes owing to the influences of opening portions 4. If the recess portion 5 is formed in the (111) plane, the recess portion 5 is not parallel or perpendicular to the facet but rotates through 45°.

Figure 3B:
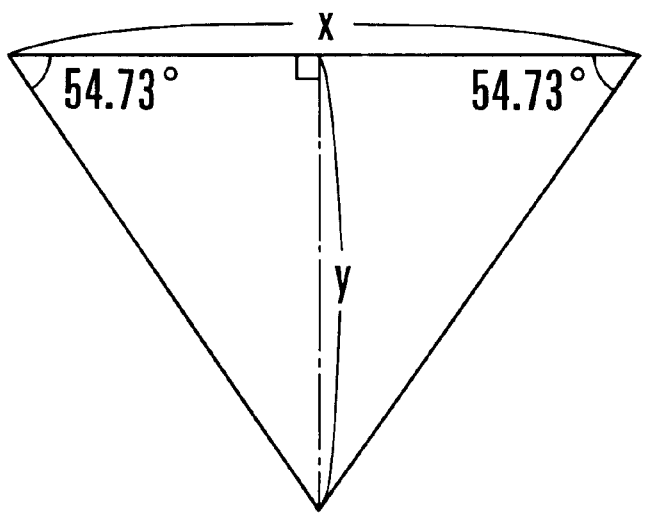

As is obvious from FIGS. 3A and 3B, if the silicon substrate with the (100) plane orientation is anisotropically etched by using an alkali, the relationship between the opening (x: length) of the recess portion and the deepest portion (y: depth) is expressed by $$y=(½) \cdot x \cdot \tan \theta \quad (1)$$

If, therefore, a 400-μm-square opening portion is formed as in the above case, about 283 (μm) is obtained as the value of y by substitution of x=400 and θ=54.73 (because the angle defined by the (100) plane and the (111) plane is about 54.73°) into equation (1). In Example 1, the measured value of θ was 55 to 57°. As is obvious from this value of θ, even if etching stops at a high-order plane, a recess portion similar to the one formed when etching stops at the (111) plane is formed.

EXAMPLE 2

Example 2 used a substrate on which a 0.3-μm thick silicon nitride film was formed instead of the silicon oxide film in Example 1. To form a pattern on the silicon nitride film on the lower surface of a nonvolatile memory region, the lower surface was coated with a positive photoresist, and a 5×5 array of 400-μm-square opening portions were formed on the resist at a pitch of 500 μm by a common photolithographic process.

Opening portions were then formed in the silicon nitride film by reactive ion etching (RIE) using this resist pattern as a mask and carbon tetrafluoride gas. The resultant structure was etched for six hours by using an aqueous KOH solution as in Example 1. As a result, an array of 280-μm deep recess portions in the shape of a quadrangular prism were formed in the substrate. The optical characteristics of the resultant structure were the same as those in Example 1.

EXAMPLE 3

A 0.3-μm thick silicon nitride film was formed on the mirror-polished lower surface of a 400-μm thick silicon substrate with the (110) plane orientation, on the upper surface of which integrated circuits were formed, by the CVD method. After the upper surface circuit side was protected by the same method as that in Example 1, seven parallel patterns, each having a line width of 400 μm and a length of 4 mm, were formed at a pitch of 500 μm to be aligned with the <1, −1, −2> orientation by photolithography and RIE as in Example 2 (FIG. 4).

When the substrate was etched by using an aqueous NaOH solution, grooves, each having a 320-μm deep central portion and a rectangular cross-section, were formed. The corner portions of the grooves had complicated shapes. Semiconductor chips were obtained by dicing this substrate. Each chip was bonded to a glass epoxy board, with an adhesive, with the circuit surface opposing thereto. When the semiconductor chip was mechanically separated from the board, the groove portion was crushed.

EXAMPLE 4

One 2-mm-square pattern having the same size as that of a nonvolatile memory was formed as a recess portion pattern (FIG. 5) equivalent to each recess portion in Example 1.

Etching was performed at 95° C. using an aqueous 40% KOH solution to form a 280-μm deep recess portion in the shape of a quadrangular frustum in about 90 minutes. Although the surface of the bottom portion of the quadrangular frustum recess portion was smooth, moderate, irregular projections were formed on the surface. A laser beam was transmitted through this portion, and an image could be observed with a laser microscope. However, a global image was distorted. This thin film portion was mechanically fragile. When, therefore, the semiconductor chip was separated from a glass epoxy board by the same method as in the third embodiment after the chip was bonded to the board, the chip was crushed.

EXAMPLE 5

A combination of different rectangular opening portions were formed as opening portions in a silicon oxide film, which were equivalent to those in Example 1, in the lower surface of a 3-mm-square region including a nonvolatile memory region (FIG. 6). The resultant structure was etched in the same manner as in Example 4 to form V-shaped grooves as recess portions. This pattern made it difficult to perform observation with a microscope from the lower surface side, i.e., the inclined surfaces of the recess portion. In addition, the silicon substrate was made fragile. Furthermore, the formation of a 0.3-μm thick tungsten film on the entire lower surface by sputtering made it more difficult to observe a circuit pattern on the upper surface from the lower surface side with a microscope.

EXAMPLE 6

Figure 7:
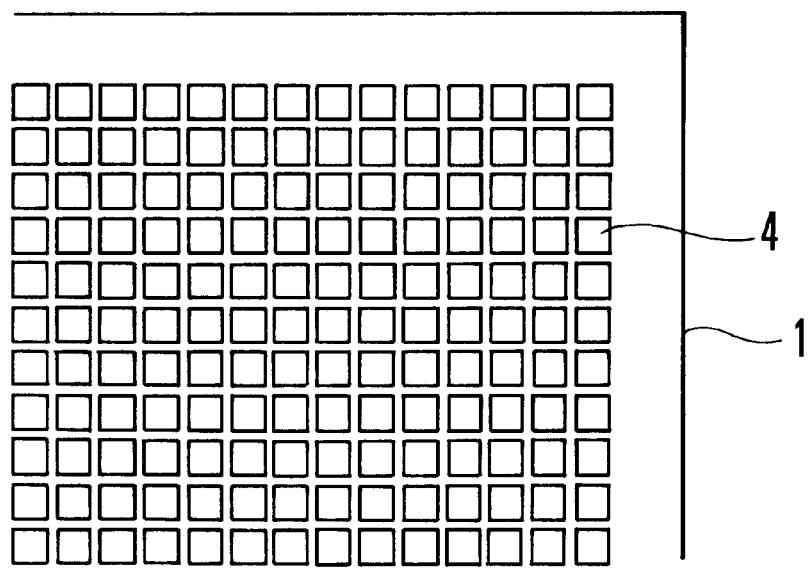

The formation of an array of recess portions equivalent to those in Example 2 was not limited to a nonvolatile memory region, and recess portions were formed in the entire lower surface of each semiconductor chip at the same pitch (FIG. 7). As a result, the mechanical strength of the substrate uniformly decreased. In addition, the circuit on the entire surface of each semiconductor chip could not be observed from the lower surface side with a laser scanning microscope.

EXAMPLE 7

Figure 8:
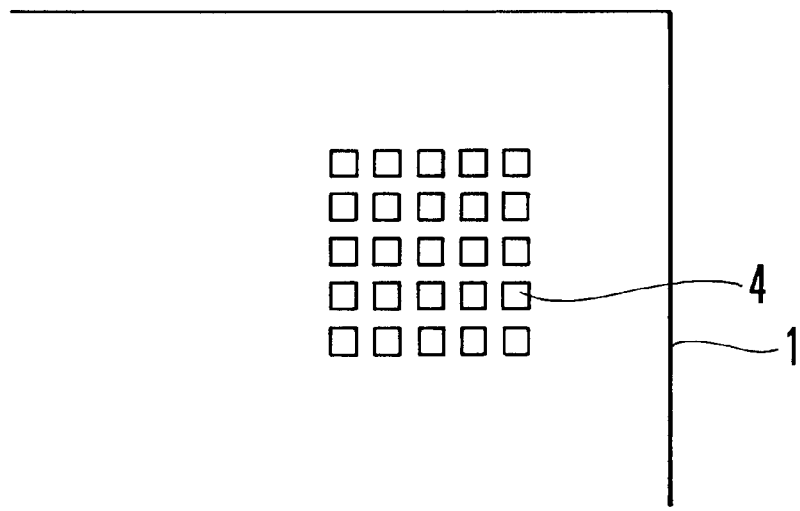
Figure 9:
FIG. 9 is a sectional view showing still another embodiment of the present invention.

A lattice array of 300-μm-square patterns were formed as opening portions in an etching mask which were equivalent to those in Example 2 (FIG. 8). Wet etching was performed by using a solution mixture of nitric acid (concentration: 60%), hydrofluoric acid (concentration: 48%), and glacial acetic acid, mixed at 3:1:1, until the depth of each recess portion became 300 μm. As a result, recess portions whose etched surfaces were curved were formed (FIG. 9). When a circuit pattern image was observed, with an infrared laser scanning microscope with a wavelength of about 1.5 μm, by causing a laser beam to vertically come into each recess portion from the lower surface side, a correct image could not be obtained at the recess portion.

As has been described above, according to the present invention, since at least one recess portion is formed in the lower surface of a portion of a semiconductor substrate which corresponds to a semiconductor chip region except for its edge, the sufficient strength for dicing and bonding can be obtained, and each semiconductor chip is easily crushed when a stress is exerted on the chip to fraudulently extract a circuit pattern.

In addition, observation with an optical means using laser measurement or the like can also be prevented depending on the shape of each recess portion, and the leakage of intellectual property information of each semiconductor chip can be easily and effectively prevented.

What is claimed is:

1. A semiconductor chip having a nonvolatile memory formed on an upper surface side of a semiconductor substrate, comprising at least one recess portion formed in a lower surface of said semiconductor substrate, wherein said recess portion is located in a region corresponding to said nonvolatile memory.

2. A chip according to claim 1, wherein said recess portion has a plurality of surfaces, and at least one of the surfaces is inclined with respect to a direction perpendicular to said semiconductor substrate.

3. A chip according to claim 2, wherein said recess portion has a V-shaped cross-section.

4. A chip according to claim 2, wherein said recess portion has a trapezoidal cross-section.

5. A chip according to claim 1, wherein a shortest distance between a bottom portion of said recess portion and an upper surface of said semiconductor chip is less than a smaller one of ½ a thickness of said semiconductor substrate and 100 $\mu$m.

6. A chip according to claim 1, wherein an inner surface of said recess portion is coated with a material having a refractive index different from that of said semiconductor substrate with respect to an electromagnetic wave falling in a wavelength range of 600 $\mu$m to 5 $\mu$m or a material through which any electromagnetic wave falling in the wavelength range cannot be transmitted.

7. A chip according to claim 1, wherein said semiconductor substrate is a silicon substrate with a (100) plane orientation.

8. A chip according to claim 1, wherein said semiconductor substrate is a silicon substrate with a (110) plane orientation.

9. A chip according to claim 1, wherein said semiconductor chip is incorporated in an IC card.

\* \* \* \* \*

UNITED STATES PATENT AND TRADEMARK OFFICE
CERTIFICATE OF CORRECTION

PATENT NO. : 6,060,773
DATED : May 9, 2000
INVENTOR(S) : Ban, et. al.

It is certified that error appears in the above-identified patent and that said Letters Patent is hereby corrected as shown below:

In [56], line 4, delete "4,453,074   6/1984   Weistein ............ 235/380" and insert -- 4,453,074   6/1984   Weinstein ............ 235/380 -- .

In [56], line 10, delete "63-19357   8/1988   Japan." and insert -- 63-193537   8/1988   Japan. -- .

Signed and Sealed this

Tenth Day of April, 2001

Attest:

NICHOLAS P. GODICI

Attesting Officer        Acting Director of the United States Patent and Trademark Office